United States Patent
Hu et al.

(10) Patent No.: US 11,070,223 B2
(45) Date of Patent: Jul. 20, 2021

(54) WIRELESS RECEIVER WITH DECOUPLED ENCODER AND DECODER RATES

(71) Applicant: HUAWEI TECHNOLOGIES CO., LTD., Guangdong (CN)

(72) Inventors: Lan Hu, Ottawa (CA); Sai Mohan Kilambi, Nepean (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 175 days.

(21) Appl. No.: 16/413,097

(22) Filed: May 15, 2019

(65) Prior Publication Data
US 2020/0366307 A1 Nov. 19, 2020

(51) Int. Cl.
*H04L 1/00* (2006.01)
*H03M 13/00* (2006.01)
*H04L 25/00* (2006.01)
*H03M 1/12* (2006.01)
*H04L 25/02* (2006.01)

(52) U.S. Cl.
CPC .......... *H03M 1/126* (2013.01); *H04L 1/0013* (2013.01); *H04L 1/0025* (2013.01); *H04L 1/0046* (2013.01); *H04L 25/0262* (2013.01)

(58) Field of Classification Search
None
See application file for complete search history.

(56) References Cited

U.S. PATENT DOCUMENTS

| | | | |
|---|---|---|---|
| 10,841,033 B2 * | 11/2020 | Kilambi | H04J 13/18 |
| 10,855,327 B2 * | 12/2020 | Kilambi | H04B 1/71075 |
| 2009/0238149 A1 | 9/2009 | Kawabata | |
| 2010/0091688 A1 * | 4/2010 | Staszewski | H04L 5/06 370/277 |
| 2014/0348252 A1 | 11/2014 | Siohan et al. | |
| 2016/0315631 A1 * | 10/2016 | Kipnis | H03M 1/12 |

FOREIGN PATENT DOCUMENTS

| | | |
|---|---|---|
| CN | 101563924 A | 10/2009 |
| CN | 107113059 A | 8/2017 |
| WO | 9945660 A1 | 9/1999 |

OTHER PUBLICATIONS

International Search Report and Written Opinion issued from the ISA/CN dated Aug. 18, 2020 in connection with the corresponding international application No. PCT/CN2020/090627.

* cited by examiner

*Primary Examiner* — Justin R Knapp
(74) *Attorney, Agent, or Firm* — BCF LLP

(57) ABSTRACT

The disclosed apparatus, structures, and methods are directed to a wireless receiver. The configurations presented herein employ a structure operative to receive a plurality of analog signals, a signal encoder configured to encode the plurality of received analog signals into a single encoded analog composite signal based on a coding scheme operating under a first code rate, a signal reconstruction module configured to segregate and reconstruct the single encoded digital composite signal into a re-encoded digital composite signal in accordance with the coding scheme operating under a second code rate. In addition, a signal decoder configured to decode the digital composite signals based on the coding scheme operating under the second code rate, and to output digital signals, in which each digital signal in the plurality of digital signals corresponds to a respective analog signal of the plurality of received analog signals.

18 Claims, 10 Drawing Sheets

WIRELESS RECEIVER WITH DECOUPLED ENCODER AND DECODER RATES

CROSS-REFERENCE TO RELATED APPLICATIONS

This is the first application filed for the instantly disclosed technology.

FIELD OF THE INVENTION

The present invention generally relates to the field of wireless communication system and, in particular, to a wireless communication receiver employing variable-rate encoding and decoding techniques to provide reduced clock rate, power consumption and signal bandwidth for efficient use of hardware and software processing resources.

BACKGROUND

In various wireless communication systems, receivers often receive multiple analog data signals each of which have been previously encoded and modulated. These multiple analog data signals may then be combined in the receiver using a code having a higher frequency rate than that of the modulated analog data signals. The combination of the received data signals in such a manner results in an output signal that is spread across a wide bandwidth. The use of high code rates to spread the data signals enables the sharing of receiver hardware resources by combining multiple input signals to a single output signal. This single output signal is then sampled by an analog-to-digital converter (ADC) eliminating the need for each receive signal path to have its own ADC. In addition to the reduction in hardware requirements, the output signal typically demonstrates a greater resistance to interference and has increased reliability (e.g., lower error vector magnitude (EVM) values).

However, it will be appreciated that the encoding of multiple analog data signals at a high code rate presents certain challenges to wireless receivers. Namely, receivers need to employ hardware, software, and firmware elements that are capable of operating at higher speeds to properly process the high code rate signals.

These challenges may be exacerbated by certain proposed enhancements to existing wireless communication systems as well as next-generation wireless communication designs. Such enhancements and designs include the deployment of high speed encoder, high sampling rate ADCs to sample high code rate signals, high speed decoder etc. Such enhancements and designs potentially strain existing receiver hardware and software processing resources.

SUMMARY

An object discussed in the present disclosure is to provide a wireless receiver for processing analog signals. The disclosure presented herein employs a structure operative to receive a plurality of analog signals. A signal encoder configured to encode a plurality of received analog signals, in accordance with an orthogonal coding scheme operating under a first code rate. An analog-to-digital converter configured to convert the single encoded analog composite signal into a single encoded digital composite signal containing constituent digital signals. A signal reconstruction module configured to segregate the single encoded digital composite signal into a plurality of individual spectrum signals and reconstruct the plurality of individual spectrum signals into a single re-encoded digital composite signal in accordance with the orthogonal coding scheme operating under a second code rate, wherein the first code rate and the second code rate are not related to each other. A signal decoder configured to decode the single re-encoded digital composite signal in accordance with the orthogonal coding scheme operating under the second code rate, to output a plurality of digital, each digital signal in the plurality of digital signals corresponding to a respective analog signal in the plurality of received analog signals.

In accordance with other aspects discussed in the present disclosure, the receiver wherein the signal reconstruction module comprises a spectrum extractor module configured to extract a group of individual spectrum signals having positive frequency components and a group of individual spectrum signals having negative frequency components from the single encoded digital composite signal in accordance with the second code rate, a rate change filter module configured to change the sampling rate of the group of individual spectrum signals having positive frequency components and the group of individual spectrum signals having negative frequency components, a spectrum allocation module configure to perform a shifting operation on the group of individual spectrum signals having positive frequency components and the group of individual spectrum signals having negative frequency components in accordance with a tuning frequency, and a spectrum construction module configured to combine the group of shifted, individual spectrum signals having positive frequency components and the group of shifted, individual spectrum signals having negative frequency components.

In accordance with other aspects discussed in the present disclosure, there is provided a method of processing wireless received signals. The disclosure presented herein operates to receive a plurality of analog signals and encodes the plurality of received analog signals into a single encoded analog composite signal in accordance with an orthogonal coding scheme operating under a first code rate, converting the single encoded analog composite signal to a single encoded digital composite signal containing constituent digital signals, reconstructing the single encoded digital composite signal into a single re-encoded digital composite signal by segregating the single encoded digital composite signal into a plurality of individual spectrum signals and reconstructing the plurality of individual spectrum signals into the single re-encoded digital composite signal in accordance with the orthogonal coding scheme operating under a second code rate, wherein the first code rate and the second code rate are not related to each other and decoding the single re-encoded digital composite signal in accordance with the orthogonal coding scheme operating under the second code rate, to output a plurality of digital signals, each digital signal in the plurality of digital signals corresponding to a respective analog signal in the plurality of received analog signals.

In accordance with other aspects discussed in the present disclosure, the method of processing signals wherein the reconstructing of the single encoded digital composite signal further comprises extracting a group of individual spectrum signals having positive frequency components and a group of individual spectrum signals having negative frequency components from the single encoded digital composite signal, changing the sampling rate of the group of individual spectrum signals having positive frequency components and the group of individual spectrum signals having negative frequency components, shifting the group of individual spectrum signals having positive frequency components and the group of individual spectrum signals having negative frequency components in accordance with a tuning frequency, and combining the group of shifted, individual spectrum signals having positive frequency components and the group of shifted, individual spectrum signals having negative frequency components.

BRIEF DESCRIPTION OF THE FIGURES

The features and advantages discussed in the present disclosure will become apparent from the following detailed description, taken in combination with the appended drawings, in which.

Figure 1:
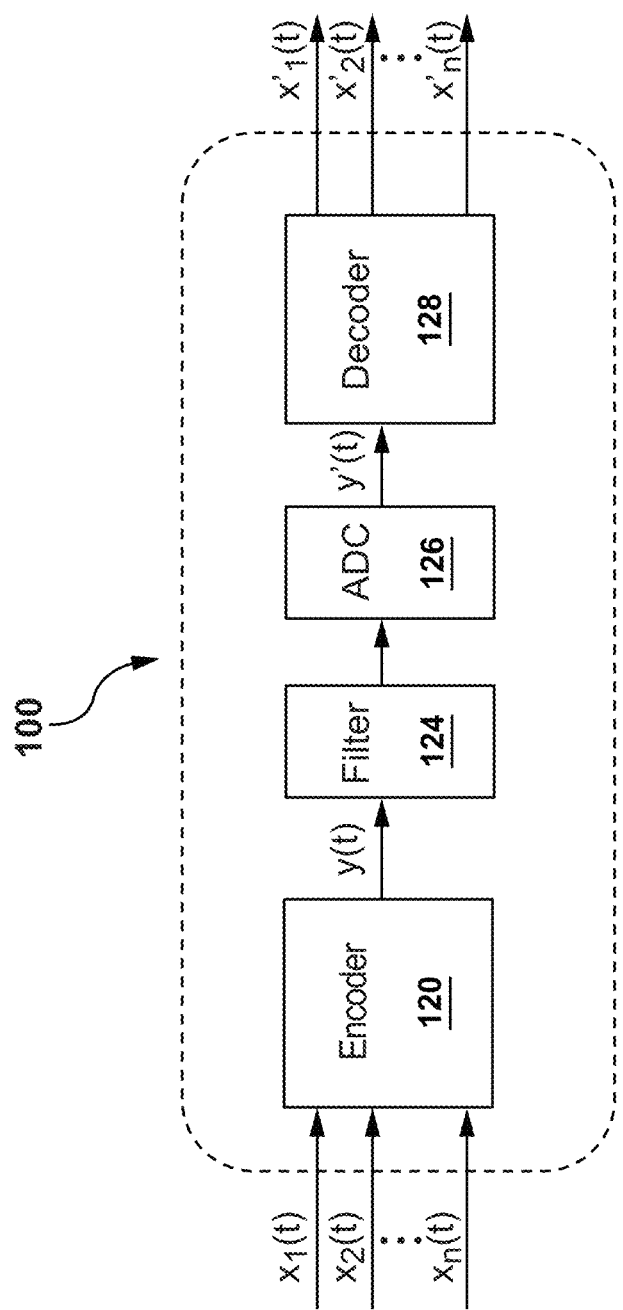
FIG. 1(Prior Art) depicts a high-level functional block diagram of a conventional wireless communication receiver.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain.

FIG. 1(Prior Art) illustrates a functional block diagram of a conventional wireless receiver 100 directed to processing received analog signals. The conventional wireless receiver 100 includes an encoder 120, a filter 124, an analog-to-digital converter (ADC) 126, and a decoder 128. Other elements may be present but not illustrated for purposes of tractability and simplification.

As illustrated by FIG. 1, conventional wireless receiver 100 receives n analog input signals $x_1(t), x_2(t) \ldots x_n(t)$, which may be received by one or more antenna structures (not shown), such as, for example, MIMO/M-MIMO antennas. It will be understood that each of the received signals may possess different modulation/encoding characteristics.

As shown, the n analog input signals $x_1(t), x_2(t) \ldots x_n(t)$ are forwarded to encoder 120. Encoder 120 is configured to encode and convert the n analog input signals $x_1(t), x_2(t) \ldots x_n(t)$ into a single, composite, encoded analog signal y(t), at a much higher rate than that of the n individual analog input signals $x_1(t), x_2(t) \ldots x_n(t)$, in accordance with a spread-coding scheme implemented by encoder 120.

In particular, the encoding operation of encoder 120 is accomplished by mixing the analog input signals $x_1(t), x_2(t) \ldots x_n(t)$ with a spread-coding scheme. The outputs of the mixing operation may be subsequently combined to yield a single analog composite signal y(t).

It will be appreciated that the spread-coding scheme may be based on any orthogonal codes or PN sequences such as, for example, Walsh, Hadamard, Gold, Barker codes, etc. These codes exhibit desirable coding characteristics and may be implemented at a substantially higher code rate than the data rate of received analog input signals $x_1(t), x_2(t) \ldots x_n(t)$. In so doing, encoder 120 outputs a single, composite, high-rate analog signal y(t) that is effectively spread across a wide frequency bandwidth.

As illustrated in the embodiment of FIG. 1, the encoded analog composite signal y(t) is provided to an anti-aliasing filter 124 to attenuate the higher frequencies components and prevent the aliasing components from being sampled. The anti-aliasing filter may comprise a low-pass filter or a band-pass filter with suitable cut-off frequencies.

The filtered, encoded analog composite signal y(t) is then supplied to a high bandwidth ADC 126, which operates to convert the filtered version of analog composite signal y(t) into a digital composite signal y'(t).

The digital composite signal y'(t) can then be transmitted for further processing, such as, for example, for decoding operations performed by decoder 128. The decoder 128 processes digital composite signal y'(t) to decode and segregate the digital composite signal y'(t) into constituent n digital signals $x'_1(t), x'_2(t) \ldots x'_n(t)$ that encompass the information contained by the originally-received n analog input signals.

In particular, decoder 128 receives and processes digital composite signal y'(t) by mixing the digital composite signal y'(t) with the spread-coding scheme at the same rate as that was used for encoding the originally-received analog input signals $x_1(t), x_2(t) \ldots x_n(t)$ by encoder 120. The resulting mixed samples may be then integrated to generate n digital signals $x'_1(t), x'_2(t) \ldots x'_n(t)$.

As noted above, conventional wireless receiver 100 requires entities that may be implemented in at least one of dedicated hardware and software processes executed on hardware platforms, such as, for example, the encoder 120, ADC 122, decoder 128, to operate at high processing speeds to accommodate the processing of the encoded, high-rate, wideband signals.

Figure 2A:
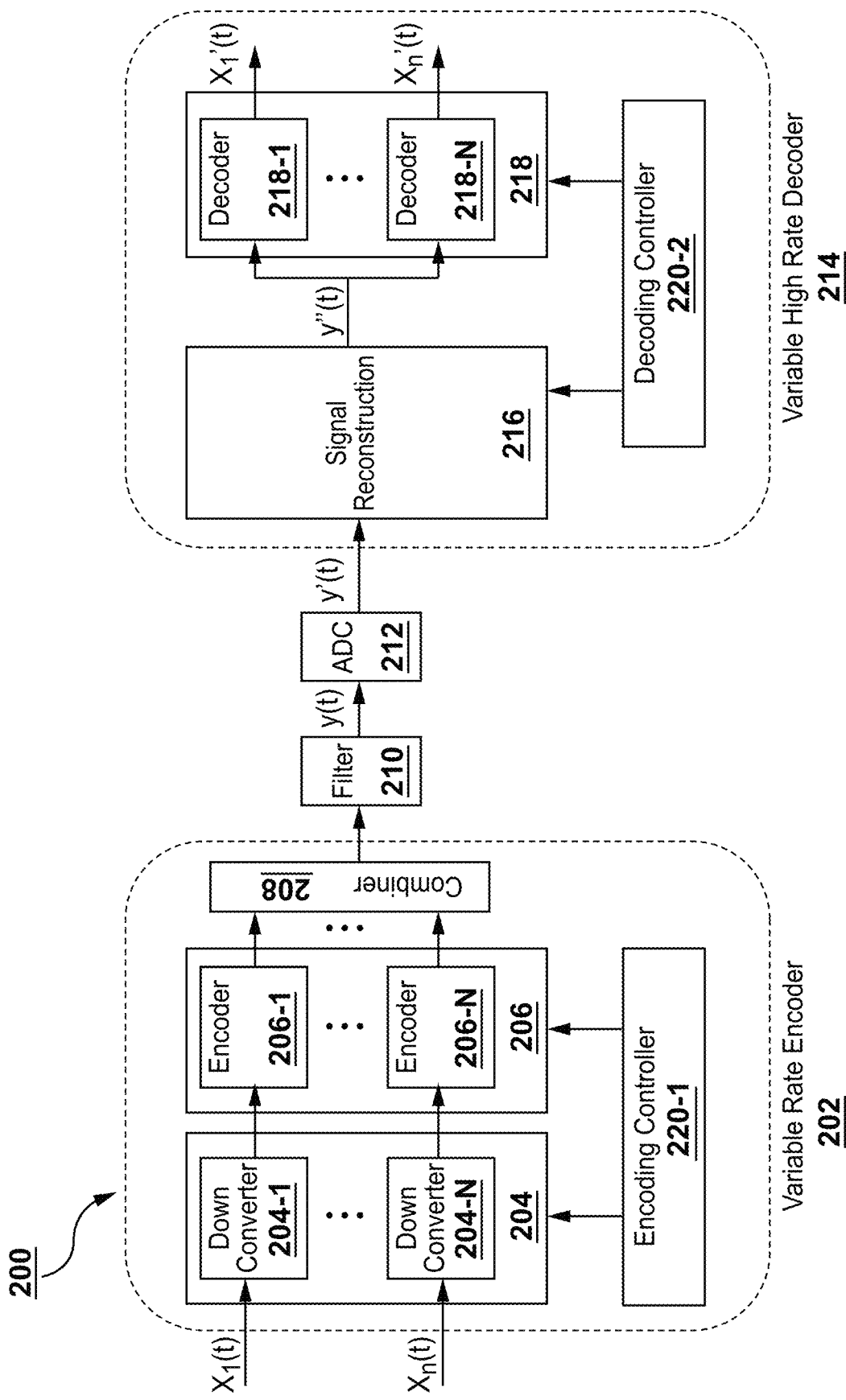
FIG. 2A depicts a high-level functional block diagram of a representative variable-rate encoder and decoder-based wireless receiver, in accordance with various embodiments discussed in the present disclosure.

FIG. 2A depicts a functional block diagram of variable-rate encoder and decoder-based wireless receiver 200, in accordance with various embodiments discussed in the present disclosure. As shown, variable-rate encoder and decoder based wireless receiver 200 employs a variable-rate encoder 202, a filter module 210, an ADC 212, and a variable-rate decoder 214. Other elements may be present but not illustrated for purposes of tractability and simplicity.

As will be understood in view of the ensuing descriptions and, in accordance with various embodiments discussed in the present disclosure, the implementation of variable-rate encoder 202 and variable-rate decoder 214 operates to decouple encoding rate from decoding rate while maintaining data recovery integrity. In so doing, variable-rate encoder and decoder receiver 200 substantially relaxes the hardware/software processing speeds, power consumption and bandwidth required to otherwise accommodate the processing of the encoded, high-rate, wide-band signals.

Moreover, consistent with various embodiments discussed in the present disclosure, it will be appreciated that some or all of the noted elements of variable-rate encoder and decoder-based wireless receiver 200, such as, for example, variable-rate encoder 202, filter module 210, ADC 212, and variable-rate decoder 214, may be implemented by software/firmware constructs to facilitate integration with existing receivers. In some embodiments some or all of these elements may be implemented as dedicated hardware.

With this said, as depicted in FIG. 2A, variable-rate encoder 202 employs a down converter 204, an encoder 206, a combiner 208, and an encoding controller module 220-1. The variable-rate encoder 202 receives the n analog input signals $x_1(t)$, $x_2(t)$ . . . $x_n(t)$ and is configured to encode and convert the n analog input signals $x_1(t)$, $x_2(t)$ . . . $x_n(t)$ into a single, composite, encoded analog signal y(t), in accordance with a spread-coding scheme that is configured to have a code rate that could be either lower or higher than the decoder code rate. In one illustrative example, the code rate for the spread-coding scheme may be based on a baseband signal rate instead of the higher modulated rate of the n received analog input signals $x_1(t)$, $x_2(t)$ . . . $x_n(t)$ to enable the envelope signal encoding. In so doing, the n analog input signals $x_1(t)$, $x_2(t)$ . . . $x_n(t)$ are encoded at a lower rate than the decoder rate, thereby resulting in a composite, encoded analog signal y(t) having a reduced bandwidth that accommodates and allows for reduced hardware and software speed requirements.

In another illustrative example, the code rate for the spread-coding scheme may be based on higher modulated rate of the n received analog input signals $x_1(t)$, $x_2(t)$ . . . $x_n(t)$. In so doing, the n analog input signals $x_1(t)$, $x_2(t)$ . . . $x_n(t)$ are encoded at a higher rate than the decoder rate, thereby resulting in a composite, encoded analog signal y(t) having an increased bandwidth. Encoding controller module 220-1 operates to select and supply the value of code rate to encoder 206. The value of code rate may be selected on the basis of various factors such as capacity of a system's hardware/software processing speeds, power consumption, and bandwidth handling capability etc.

In accordance with various embodiments of present disclosure, as shown in FIG. 2A, the n analog input signals $x_1(t)$, $x_2(t)$ . . . $x_n(t)$ received by variable-rate encoder 202 are supplied to down converter 204. Down converter 204 employs a bank of individual down converters 204-1, 204-2 . . . 204-N to generate frequency signals and operate to shift the input signals to an intermediate frequency (IF) by mixing the input signals with generated frequency signals. It is to be understood that encoding controller module 220-1 may provide the value of intermediate frequency to down converter 204. The n IF-shifted input signals are then forwarded to encoder 206.

Encoder 206 further employs a bank of individual encoders 206-1, 206-2 . . . 206-N to generate a spread-coding scheme at a code rate as supplied by encoding controller module 220-1 and operates to encode the n IF-shifted input signals by mixing the n IF-shifted input signals with the generated spread-coding scheme to render spread-shifted input signals. The spreading of input signal expands the bandwidth of input signals and the shifted and spread input signals are then forwarded to combiner unit 208, which operates to combine the shifted and spread n input signals $x_1(t)$, $x_2(t)$ . . . $x_n(t)$ into a single analog composite signal y(t).

The single, analog composite signal y(t) may then be provided to anti-aliasing filter module 210. Anti-aliasing filter 210 acts to restrict the bandwidth of interest as well as mitigate signal components that may lead to aliasing effects. The filtered, single analog composite signal y(t) may then be supplied to ADC 212, which operates to convert the filtered, single analog composite signal y(t) into a single, digital composite signal y'(t).

Returning to FIG. 2A, the digital composite signal y'(t) may then be forwarded to variable-rate decoder 214. Variable-rate decoder 214 may be situated at the same physical location as that of variable-rate encoder 202 or may be located at a remote location. Variable-rate decoder 214 may further employ a signal reconstruction module 216, a decoder 218, and a decoding controller module 220-2.

As depicted, upon receiving the digital composite signal y'(t), variable-rate decoder 214 forwards the signal y'(t) to signal reconstruction module 216. Signal reconstruction module 216 then re-constructs the received digital composite signal y'(t) by updating the encoding rate of the digital composite signal y'(t) to an updated encoding rate. The new encoding rate may be received from decoding controller 220-2, and may be determined using a spectrum re-allocation technique. Specifically, the updated encoding rate provided by decoding controller 220-2 is not configured to be related to the encoding rate provided by encoding controller 220-1. As such, any change in the encoding rate provided by encoding controller 220-1 does not affect the encoding rate provided by decoding controller 220-2 and vice-versa. In this manner, the individual frequency components of the received digital composite signal y'(t) may be shifted to new frequency locations of the expected encoded rate. This movement of frequency components can assist decoder 218 to operate at a required decoding rate, by operating at the required data rate, the decoder 218 maintains the performance and data recovery integrity of variable-rate encoder and decoder based wireless receiver 200.

It will be appreciated that the functionality of variable-rate encoder 202 and variable-rate decoder 214 may be configured and controlled by encoding controller module 220-1 and decoding controller module 220-2 respectively. Encoding controller module 220-1 and decoding controller module 220-2 are configured to store and supply operational control parameters to various modules of variable-rate encoder 202 and variable-rate decoder 214, respectively, based on intended receiver service requirements, applications, and designs.

To this end, and in accordance with various embodiments discussed in the present disclosure, encoding controller module 220-1 and decoding controller module 220-2 may include a memory storage device to properly store control parameter data as well as a processing device to execute and communicate the control parameter data to relevant modules. For example, encoding controller module 220-1 may provide various configuration and control parameters, such as intermediate frequency data to down converter 204, at which analog input signals $x_1(t)$, $x_2(t)$ . . . $x_n(t)$ are shifted prior to encoding, code type, and encoding rate to encoder 206, so the encoder 206-1 to 206-N encodes the respective IF-shifted input signals, etc. Similarly, decoding controller module 220-2 operates to supply configuration and controlling parameters to various modules of variable-rate decoder 214 in order to ensure proper module functionality.

It will be understood that encoding controller module 220-1 and decoding controller module 220-2 may be operated as a single controller module controlling variable-rate encoder 202 and variable-rate decoder 214. Such operational alternatives do not, in any way, limit the scope discussed in the present disclosure.

Figure 2B:
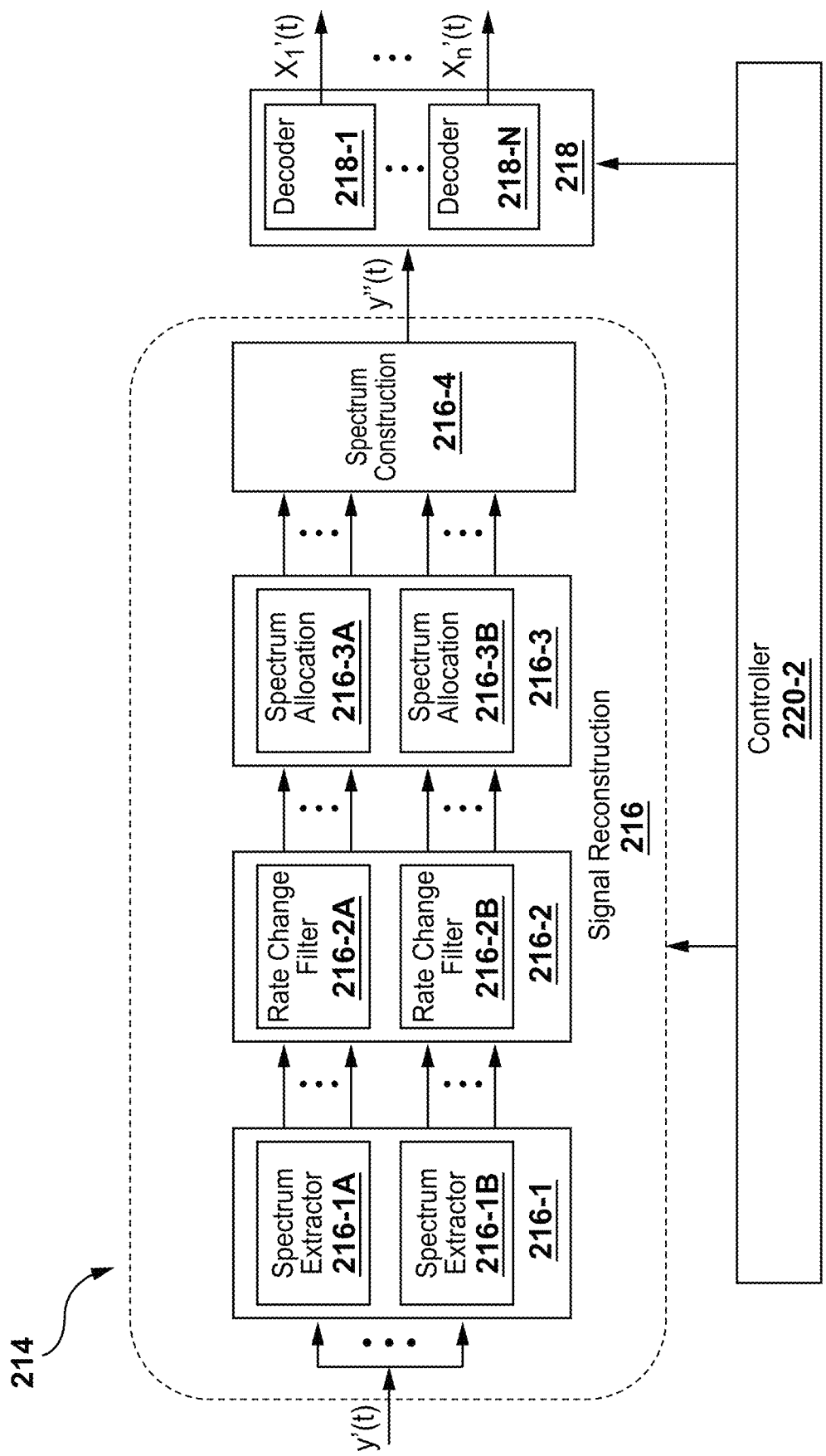
FIG. 2B depicts a high-level functional block diagram of a representative variable rate decoder, in accordance with various embodiments discussed in the present disclosure.

FIG. 2B provides a more detailed functional diagram of variable-rate decoder 214, in accordance with various embodiments of present disclosure. As shown, signal reconstruction module 216 incorporated in variable-rate decoder 214, further employs a spectrum extractor module 216-1, a rate change filter module 216-2, a spectrum allocation module 216-3, and a spectrum construction module 216-4.

Given the depicted configuration, the received digital composite signal y'(t) may then be fed to spectrum extractor module 216-1. Spectrum extractor module 216-1 is configured to extract the spectrum and segregate the received digital composite signal y'(t) into two groups of digital spectrum signals y'$_R$(t) and y'$_I$(t). The group of digital spectrum signals y'$_R$(t) constitute n individual digital spectrum signals having positive frequency (real frequency) components corresponding to spectrum of n individual shifted and spread input signals $x_1(t)$, $x_2(t)$ . . . $x_n(t)$. Similarly, group of digital signals y'$_I$(t) constitute n individual digital spectrum signals having negative frequency (image frequency) components corresponding to spectrum of n individual shifted and spread input signals $x_1(t)$, $x_2(t)$ . . . $x_n(t)$.

The extracted groups of digital spectrum signals y'$_R$(t) and y'$_I$(t) may then be supplied to rate change filter module 216-2. Rate change filter module 216-2 is configured to convert the sampling rate of extracted groups of digital spectrum signals y'$_R$(t) and y'$_I$(t), consistent with the decoding rate. The output of rate change filter 216-2 may then be provided to spectrum allocation module 216-3. Spectrum allocation module 216-3 may then shifts the frequency locations of individual digital spectrum signals contained in group of digital spectrum signals y'$_R$(t) and y'$_I$(t) to the updated frequency locations, as provided by decoding controller module 220-2. The output of spectrum allocation module 216-3 may then be combined using spectrum construction module 216-4. The combined spectrum may then be decoded using decoder 218 to generate n digital signals x'$_1$(t), x'$_2$(t) . . . x'$_n$(t) that encompass the information contained by the originally-received n analog input signals.

Figure 2C:
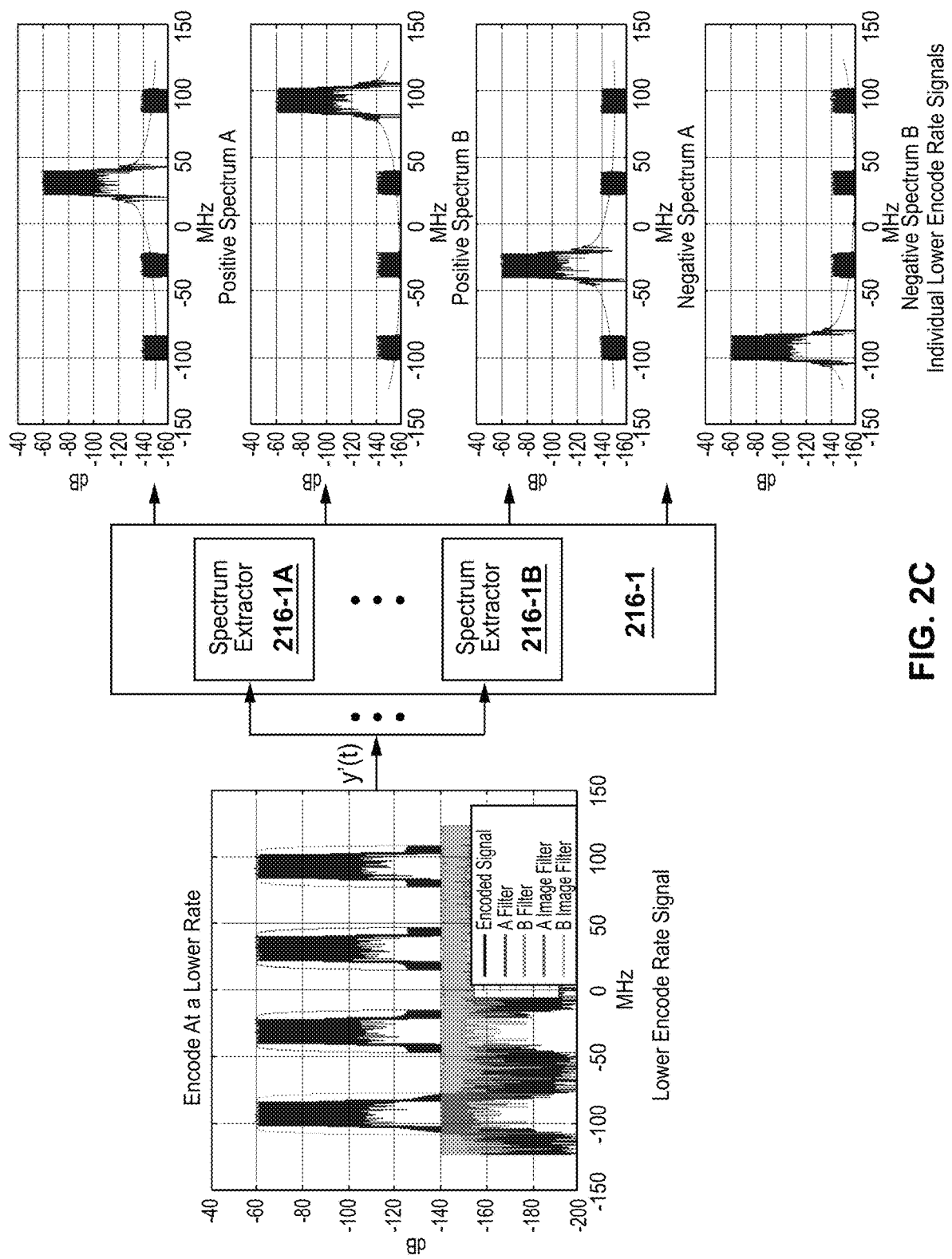
FIG. 2C depicts a high-level functional block diagram of a representative spectrum extractor module, in accordance with various embodiments discussed in the present disclosure.

As illustrated by FIG. 2C, a high level functional block diagram of spectrum extractor module 216-1, in accordance with various embodiments of present disclosure. Spectrum extractor module 216-1 employs a spectrum extractor 216-1A, and a spectrum extractor 216-1B. Spectrum extractor 216-A further incorporates a bank of single-band selecting filter capable of extracting individual positive frequency (real frequencies) spectrum corresponding to spectrum of n individual shifted and spread input signals $x_1(t)$, $x_2(t)$ . . . $x_n(t)$. Similarly spectrum extractor 216-1B further incorporates a bank of single-band selecting filter capable of extracting individual negative frequency (image frequencies) spectrum corresponding to spectrum of n individual shifted and spread input signals $x_1(t)$, $x_2(t)$ . . . $x_n(t)$, from the digital composite signal y'(t) received by spectrum extractor module 216-2.

FIG. 2C further depicts an exemplary representative spectral properties of spectrum of digital composite signal y'(t) encoded at a rate lower than the decoder rate, extracted, individual digital spectrum signals, having positive frequency components, from digital composite signal y'(t), and extracted, individual digital spectrum signals, having negative frequency components, from digital composite signal y'(t), in accordance with spectral properties of single-band selecting filters.

It is to be understood that single-band selecting filters may be designed based on type of codes used and the rate at which these codes are generated, for encoding and decoding of n analog input signals $x_1(t)$, $x_2(t)$ . . . $x_n(t)$. The design may also be based on signal bandwidth, out-band rejection ratio and image rejection attenuation requirements in order to successfully extract the desired spectrums and reject unwanted frequencies. To this end, decoding controller module 220-2 may provide spectrum extractor 216-1A and 216-21B with band selection filter coefficients.

Figure 2D:
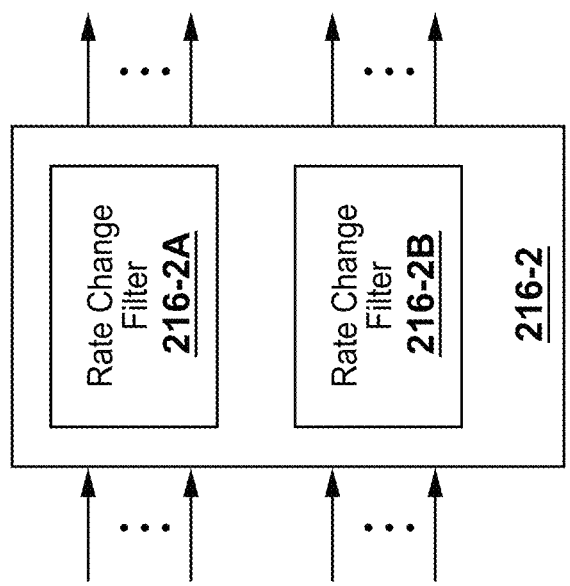
FIG. 2D depicts a high-level functional block diagram of a representative rate change filter module, in accordance with various embodiments discussed in the present disclosure.

Moving forward to FIG. 2D illustrating a high level functional block diagram of rate change filter module 216-2, in accordance with various embodiments of present disclosure. Rate change filter module 216-2 may employ a rate change filters 216-2A and 216-2B. The extracted groups of digital spectrum signals y'$_R$(t) and y'$_I$(t) by spectrum extractor module 216-1 may then be forwarded to rate change filters 216-2A and 216-2B respectively.

Rate change filters 216-2A and 216-2B may then operate to change the sampling rate of individual digital spectrum signals in groups of digital signals y'$_R$(t) and y'$_I$(t) respectively in order to make the rate consistent with the desired sampling rate, as provided by decoding controller module 220-2. Further, the value of change in sampling rate may be an integer value or a non-integer value depending upon the ratio of desired sampling rate to the current sampling rate of the signal. It is to be understood that, rate change filter module 216-2 may employ any suitable, non-limiting techniques directed to changing sampling rates, without departing from the principles presented herein.

One such technique, may be utilized by rate change filter module 216-2, is by interpolating the received signals so as to increase the sampling rate of the received signal by an integer factor L. The sampling rate of the received signal may be expanded, either, by inserting L−1 zero-valued samples between the signal's existing data samples or by repeating individual sample L times, resulting in a signal having an intermediate sample rate L times the original sampling rate.

Interpolated signal may then be supplied to a suitable low pass or a band pass filter to remove any images or high frequency noise introduced by the rate expansion. The filtered signal may then be decimated, so as to reduce the sample rate of the filtered signal by an integer factor M. The sampling rate of the received signal may then be reduced by removing M−1 data samples for every M data samples, resulting in an output signal having the desired sampling rate.

The output of rate change filter module 216-2 incorporating rate change filter 216-3A and rate change filter 216-3B may be a group of individually resampled, digital spectrum signals y'$_R$(t) and a group of individually resampled, digital spectrum signals y'$_I$(t) with the updated sampling rate as L/M. The value of L and M may depend on the ratio required sampling rate and current sampling rate of individual spectrum signals.

The rate change filter control parameters may be provided by decoding controller module 220-2. Such control parameters may include, for example, change in rate parameters, rate change filter coefficients etc.

Figure 2E:
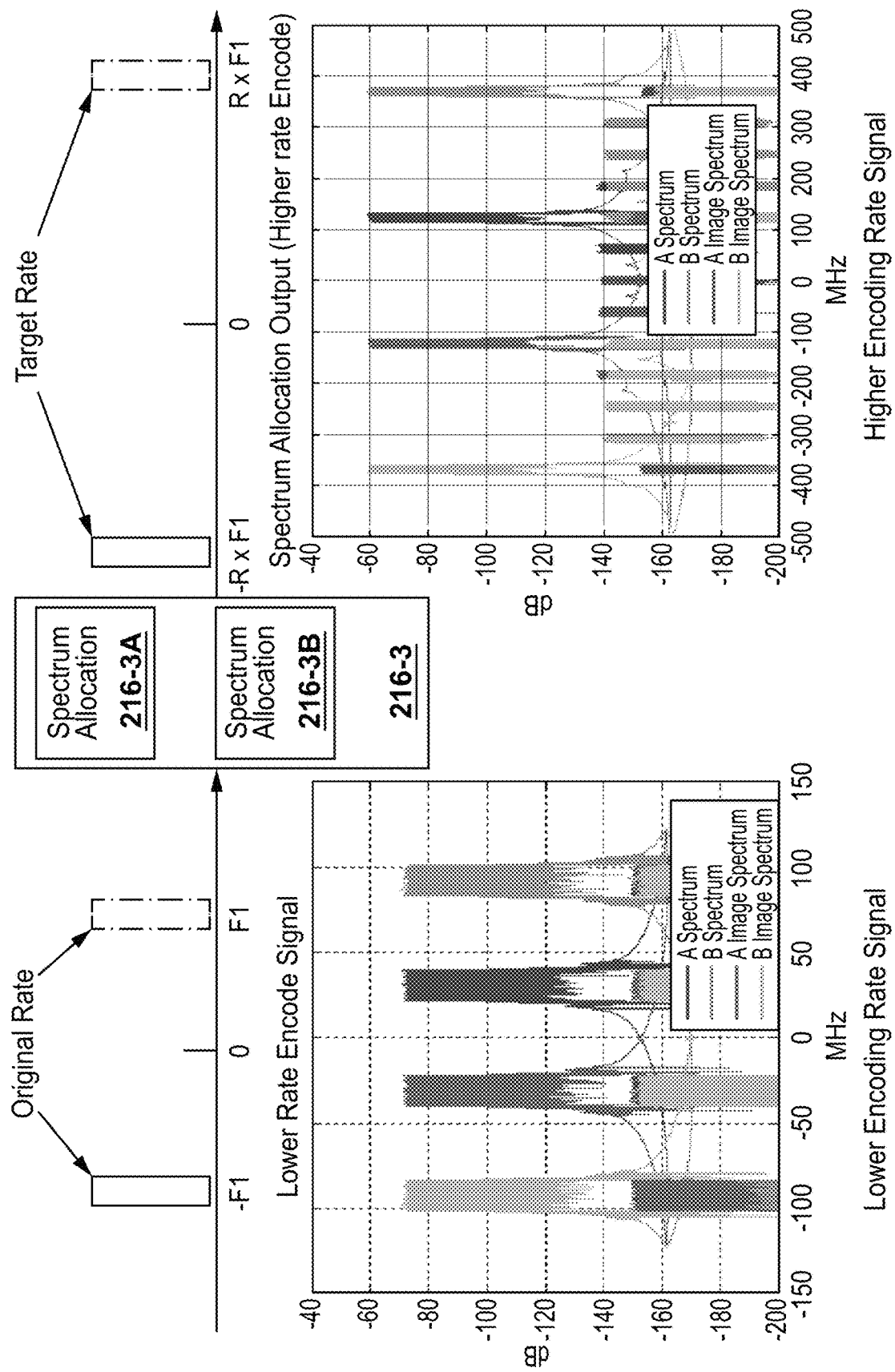
FIG. 2E depicts a high-level functional block diagram of a representative spectrum allocation module, in accordance with various embodiments discussed in the present disclosure.

As indicated, FIG. 2E illustrates a high level functional block diagram of spectrum allocation module 216-3, in accordance with various embodiments of present disclosure. Spectrum allocation module 216-3 employs a spectrum allocator 216-3A and a spectrum allocator 216-3B. The group of individually resampled, digital spectrum signals y'$_R$(t) by rate change filter 216-2A may then be forwarded to spectrum allocator 216-3A and the group of individually resampled, digital spectrum signals y'$_I$(t) by rate change filter 216-2B may then be forwarded to spectrum allocator 216-3B.

Spectrum allocation module 216-3 operates to shift the frequency locations of the output signals from rate change filter module 216-3 in order to make the current frequency locations consistent with the desired frequency location, as provided by decoder controller module 220-2. Further, the amount of shift in frequency locations may be an integer value depending upon the ratio of desired encoding rate, as provided by decoding controller module 220-2, to the initial encoding rate at variable-rate encoder 202. In so doing, spectrum allocation module 216-3 may employ any suitable, non-limiting techniques directed to shifting the frequency locations, without departing from the principles presented herein.

One such technique, may be utilized by spectrum allocation module 216-3, is by generating a tuning frequency and shifting the input signals by mixing the input signals with generated tuning frequency. For instance, spectrum allocator 216-3A may generate a tuning frequency in accordance with the shifting ratio R and operate to shift the frequency components in individually resampled, digital spectrum signals y'$_R$(t). Similarly spectrum allocator 216-3B may generate a tuning frequency in accordance with the shifting ratio –R and operate to shift the frequency components in individually resampled, digital spectrum signals y'$_I$(t). Where, shifting ratio R is the ratio of desired encoding rate, at variable-rate decoder 214 to the initial encoding rate at variable-rate encoder 202. It is to be understood that the value of shifting ratio R can be greater or smaller than 1, i.e. when R is greater than 1, desired encoding rate will be higher than initial encoding rate and when R is smaller than 1, desired encoding rate will be lower than initial encoding rate.

The spectrum allocation control parameters may be provided by decoder controller module 220-2. Such control parameters may include, for example, individual spectrum shift frequency, and desired encoding rate.

Further, FIG. 2E illustrates an exemplary shift in frequencies of input signal. As shown, central frequency $F_1$ of a digital spectrum signal having positive frequency components is shifted to [R×$F_1$]. Similarly, central frequency –$F_1$ of a digital spectrum signal having negative frequency components is shifted to –[R×$F_1$]. Also FIG. 2C depicts exemplary representative spectral properties of spectrum of a group of individually resampled, digital spectrum signals y'$_R$(t) and a group of individually resampled, digital spectrum signals y'$_I$(t) encoded at a lower rate, as input to spectrum allocation module 216-3 and representative spectral properties of spectrum of a group of individually shifted, digital spectrum signals y'$_R$(t) and a group of individually shifted, digital spectrum signals y'$_I$(t) at higher encoding rate, as output of spectrum allocation module 216-3.

Figure 2F:
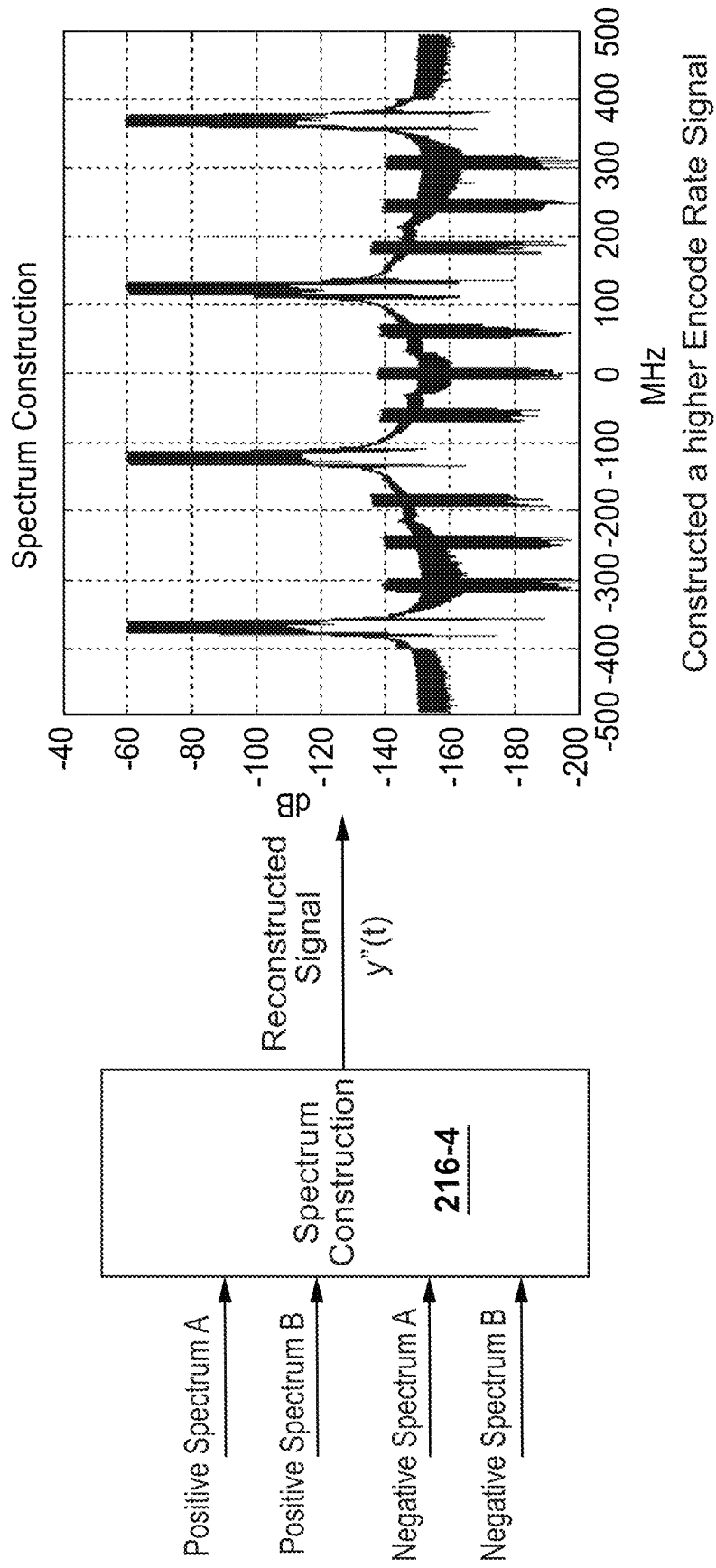
FIG. 2F depicts a high-level functional block diagram of a representative spectrum construction module, in accordance with various embodiments discussed in the present disclosure.

Proceeding to FIG. 2F, illustrating a high level functional block diagram of spectrum construction module 216-4, in accordance with various embodiments of present disclosure. Spectrum construction module 216-4 operates to combine the outputs from spectrum allocation module 216-3 to form a re-encoded digital composite signal y"(t). FIG. 2F further illustrates representative spectral properties of a re-encoded digital composite signal y"(t).

The spectrum construction control parameters may be provided by decoder controller module 220-2. Such control parameters may include, for example, number of input signals.

Going back to FIG. 2B, the re-encoded digital composite signal y"(t) is then subsequently transmitted for further processing, such as, for example, decoding operations performed by decoder 218. Decoder 218 further employs a bank of individual decoders 218-1, 218-2 . . . 218-N configured to decode the re-encoded digital composite signal y"(t) in order to segregate the re-encoded digital composite signal y"(t) into constituent n digital signals x'(t), x'$_2$(t) . . . x'$_n$(t) that encompass the information contained by the originally-received n analog input signals. In so doing, decoder 128 receives and processes the re-encoded digital composite signal y"(t) by mixing the re-encoded digital composite signal y"(t) with the spread-coding scheme at a rate, as provided by decoding controller module 220-2. The resulting mixed samples may be then integrated to generate digital input signals x'$_1$(t), x'$_2$(t) . . . x'$_n$(t).

Decoder control parameters may be provided by decoding controller module 220-2. Such control parameters may include, for example, decoding rate.

Figure 2G:
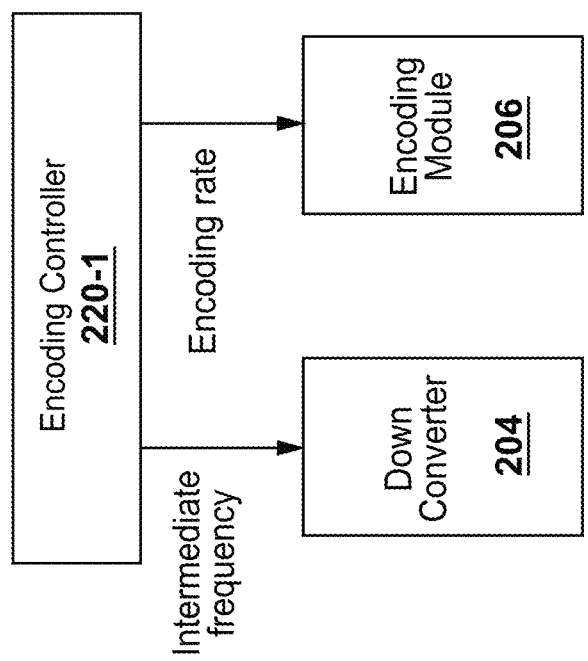
FIG. 2G depicts a high-level functional block diagram of a representative encoding controller module, in accordance with various embodiments discussed in the present disclosure.

FIG. 2G illustrates a high level functional block diagram of encoding controller module 220-1, in accordance with various embodiments of present disclosure. Encoding controller module 220-1 operates to program various modules in variable-rate encoder 202. Such as, for example, encoding controller module 220-1 may configure down converter 204 on the basis of intermediate frequency requirement, at which analog input signals $x_1$(t), $x_2$(t) . . . $x_n$(t) are to be shifted prior to encoding. Further, encoding controller module 220-1 may configure encoder 206 on the basis of code type, and encoding rate handling capabilities of variable-rate encoder 202.

Figure 2H:
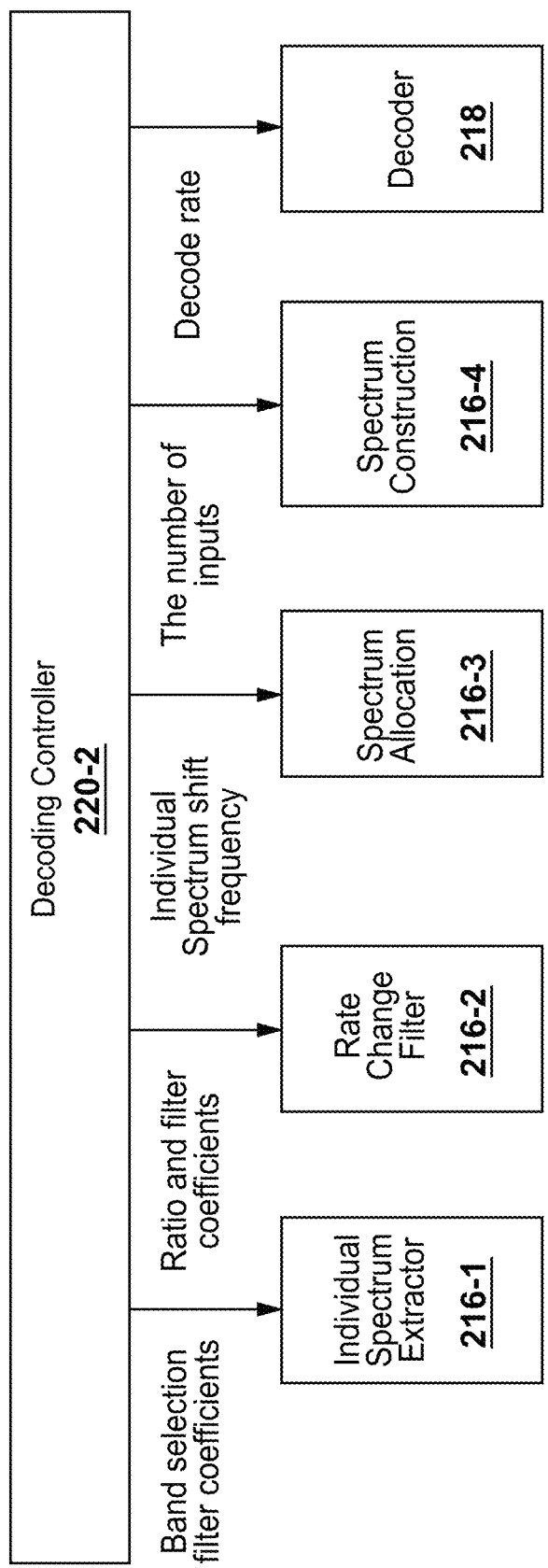
FIG. 2H depicts a high-level functional block diagram of a representative decoding controller module, in accordance with various embodiments discussed in the present disclosure.

FIG. 2H illustrates a high level functional block diagram of decoding controller module 220-2, in accordance with various embodiments of present disclosure. Decoding controller module 220-2 operates to program various modules in variable-rate decoder 214. Such as, for example, spectrum of signals encoded in variable-rate encoder 202 may depend upon code types and code rate used. Consequently, coefficients of band selecting filters required by spectrum extractor module 216-1 requisite to be programmable to be consistent with code type and rate used for encoding. Further, change in sampling rate and filter coefficients required by rate change filter 216-2 may be determined by a desired encoding rate. Also, individual spectrum shift frequency/tuning frequency required by spectrum allocation module 216-3 may depend upon desired encoding rate. Further, spectrum construction module 216-4 may require the number of inputs as controlling parameter. All these controlling parameters required to program various modules in variable-rate decoder 214 are provided by decoding controller module 220-2.

It is to be understood, various modules of variable-rate encoder 202 and variable-rate decoder 214 required to be programmable, and the control parameters to program these modules are supplied by encoding controller module 220-1 and decoding controller module 220-2 respectively in order to ensure proper module functionality and hence, enabling the variable-rate encoder and decoder-based wireless receiver 200 to operate at an encoding and a decoding rate which are not related to each other, adding flexibility to construct a configurable and variable-rate encoder and decoder-based wireless receiver 200.

Figure 3:
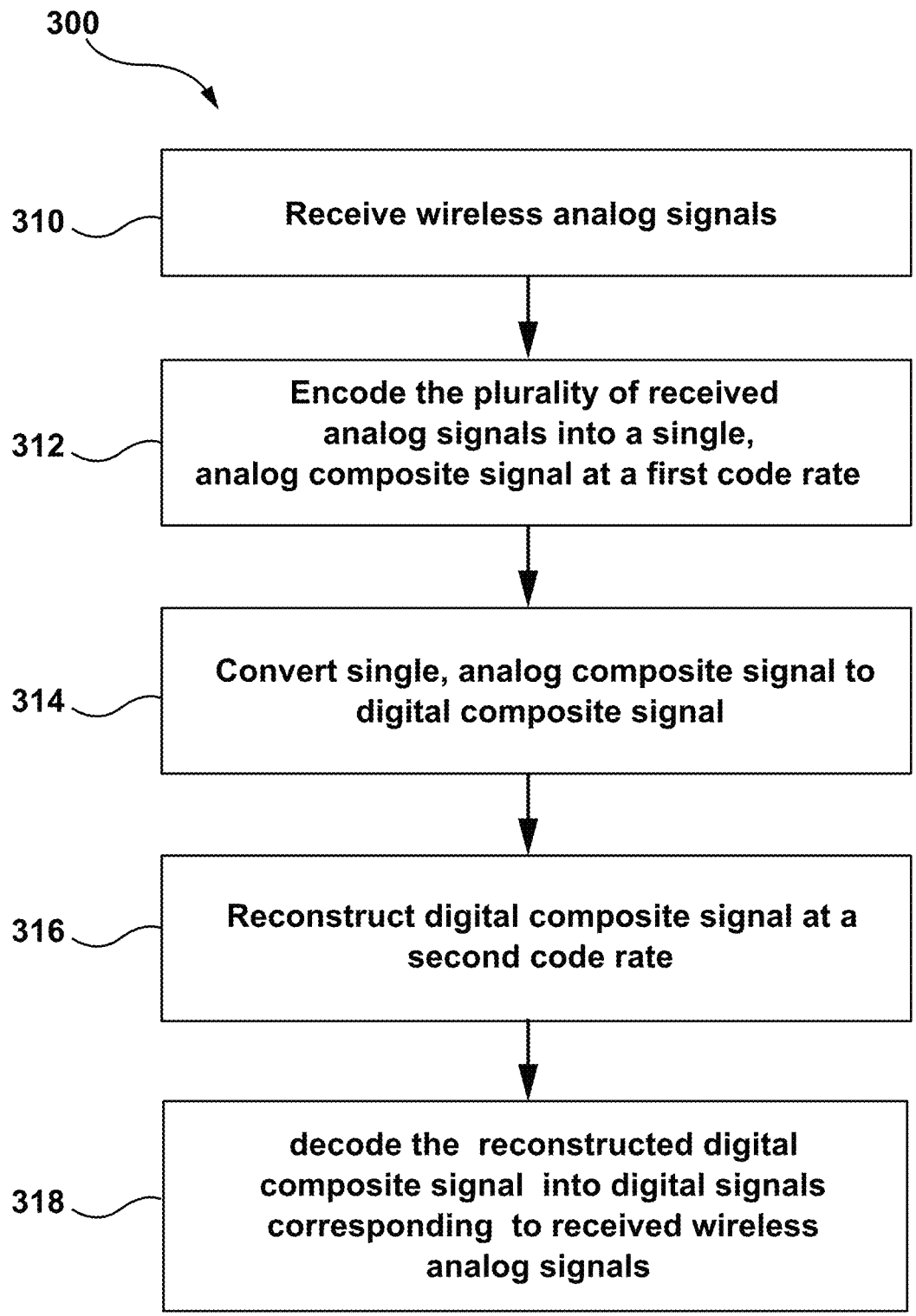
FIG. 3 depicts a functional flow diagram of variable-rate encoder and decoder-based wireless receiver processing, in accordance with various embodiments discussed in the present disclosure.

FIG. 3 depicts a functional flow diagram of process 300 directed to variable-rate encoder and decoder-based wireless receiver processing, in accordance with various embodiments discussed in the present disclosure.

As shown, process 300 begins at task block 310, in which variable-rate encoder and decoder-based wireless receiver 200 receives a plurality of analog. As noted above, receiver 200 may include one or more antenna structures operative to receive the analog signals and the received analog signals may possess different modulation/encoding attributes.

Process 300 proceeds to task block 312, where receiver 200 may down converts the frequency components of plurality of received signals to an intermediate frequency (IF) and then encodes the IF-shifted plurality of received signals into a single analog composite signal y(t), based on a coding scheme having a first code rate. As noted above, down converter 204 operates to down convert and supply the plurality of received signals to encoder 206. In turn encoder 206 operates to mix and combine multiple received signals with the coding scheme having a code rate, as provided by encoding controller module 220-1, to output a single, composite analog signal y(t).

At task block 314, receiver 200 may filters analog composite signal y(t) to restrict the bandwidth of interest and mitigate signal components that may lead to aliasing effects and convert the filtered to analog composite signal y(t) to digital composite signal y'(t). That is, as described above, filter module 210 may performs anti-aliasing filtering on analog composite signal y(t) and ADC 212 may performs analog-to-digital conversion to generate digital composite signals y'(t).

Process 300, advances to task block 316, where receiver 200 operates to re-construct digital composite signal y'(t) by re-encoding digital composite signal y'(t) at a second code rate to generate a re-encoded digital composite signal y"(t). That is, as described above, spectrum extractor module 216-1 may then extract the spectrum and segregate the received digital composite signal y'(t) into two groups of digital spectrum signals y'$_R$(t) and y'$_I$(t). The sampling rate of extracted individual digital spectrum signals in groups of digital signals y'$_R$(t) and y'$_I$(t) may then be changed by rate change filter module 216-2, to make the sampling rate consistent with the decoding rate, as provided by decoding controller module 220-2. Spectrum allocation module 216-3 may then shifts the frequency components in individually resampled, digital spectrum signals y'$_R$(t) and y'$_I$(t) to the updated locations, as provided by decoding controller module 220-2. The output of spectrum allocation module 216-3 may then be combined using spectrum construction module 216-4 to generate re-encoded digital composite signal y"(t).

Finally, at task 318, receiver 200 operates to decodes re-encoded digital composite signal y"(t) to output digital signals corresponding to the received analog signals containing the desired content. As previously described, decoder 218 operates to decode and recover the encoded signal information by mixing digital composite signals with coding scheme having a second code rate, as provided by decoding controller module 220-2, to produce digital signals corresponding to the received analog signals containing the desired content.

Thus, by virtue of the variable-rate encoding and decoding techniques employed by variable-rate encoder and decoder-based wireless receiver 200, hardware/software processing speeds are reduced, lower-bandwidth resources may be implemented, and power consumption is decreased.

It is to be understood that the operations and functionality of the variable-rate encoder and decoder-based wireless receiver 200, constituent components, and associated processes may be achieved by one or more of hardware-based, software-based, and firmware-based elements. Such operational alternatives do not, in any way, limit the scope discussed in the present disclosure.

It will also be understood that, although the embodiments presented herein have been described with reference to specific features, structures, and embodiments, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope discussed in the present disclosure.

What is claimed is:

1. A wireless receiver, comprising:
   a signal encoder configured to encode a plurality of received analog signals into a single encoded analog composite signal, in accordance with an orthogonal coding scheme operating under a first code rate;
   an analog-to-digital converter configured to convert the single encoded analog composite signal into a single encoded digital composite signal containing constituent digital signals;
   a signal reconstruction module configured to segregate the single encoded digital composite signal into a plurality of individual spectrum signals and reconstruct the plurality of individual spectrum signals into a single re-encoded digital composite signal in accordance with the orthogonal coding scheme operating under a second code rate, wherein the first code rate and the second code rate are different from each other; and
   a signal decoder configured to decode the single re-encoded digital composite signal in accordance with the orthogonal coding scheme operating under the second code rate, and to output a plurality of digital signals, in which each digital signal in the plurality of digital signals corresponds to a respective analog signal of the plurality of received analog signals.

2. The wireless receiver of claim 1, wherein the signal encoder, further comprising a down converter operative to shift the plurality of received analog signals in accordance with an intermediate frequency.

3. The wireless receiver of claim 1, further comprising a filter to minimize aliasing effects of the single encoded analog composite signal.

4. The wireless receiver of claim 1, wherein the signal reconstruction module comprises:
   a spectrum extractor module configured to extract a group of individual spectrum signals having positive frequency components and a group of individual spectrum signals having negative frequency components from the single encoded digital composite signal;
   a rate change filter module configured to change the sampling rate of the group of individual spectrum signals having positive frequency components and the group of individual spectrum signals having negative frequency components;
   a spectrum allocation module configured to perform a shifting operation on the group of individual spectrum signals having positive frequency components and the group of individual spectrum signals having negative frequency components in accordance with a tuning frequency; and a spectrum construction module configured to combine the group of shifted, individual spectrum signals having positive frequency components and the group of shifted, individual spectrum signals having negative frequency components.

5. The wireless receiver of claim 4, wherein the spectrum extractor module further comprises a plurality of first single-band filters and a plurality of second single-band filters, wherein the plurality of first single-band filters is configured to extract the group of individual spectrum signals having positive frequency components and the plurality of second single-band filters is configured to extract the group of individual spectrum signals having negative frequency components.

6. The wireless receiver of claim 4, wherein the change of sampling rate depends on the first code rate and the second code rate and may be an integer or a fractional value.

7. The wireless receiver of claim 4, wherein the spectrum allocation module configured to perform the shifting operation on the group of individual spectrum signals having positive frequency components and the group of individual spectrum signals having negative frequency components in accordance with the ratio of the second code rate and the first code rate.

8. The wireless receiver of claim 1, further comprising a controller module configured to provide control signal parameters to the signal encoder, signal reconstruction module, and the signal decoder.

9. The wireless receiver of claim 8, wherein the control signal parameters include on or more of the following: code type, code rate, sampling rate, intermediate frequency, tuning frequency and filter coefficient(s).

10. A method of processing wireless received signals, comprising:

receiving a plurality of analog signals;

encoding the plurality of received analog signals into a single encoded analog composite signal in accordance with an orthogonal coding scheme operating under a first code rate;

converting the single encoded analog composite signal into a single encoded digital composite signal containing constituent digital signals;

reconstructing the single encoded digital composite signal into a single re-encoded digital composite signal by segregating the single encoded digital composite signal into a plurality of individual spectrum signals and reconstructing the plurality of individual spectrum signals into the single re-encoded digital composite signal in accordance with the orthogonal coding scheme operating under a second code rate, wherein the first code rate and the second code rate are to different from each other; and decoding the single re-encoded digital composite signal in accordance with the orthogonal coding scheme operating under the second code rate, and to output a plurality of digital signals, in which each digital signal in the plurality of digital signals corresponds to a respective analog signal of the plurality of received analog signals.

11. The wireless processing method of claim 10, further comprising shifting the plurality of received analog signals in accordance with an intermediate frequency.

12. The wireless processing method of claim 10, further comprising filtering the single encoded analog composite signal to minimize aliasing effects.

13. The wireless processing method of claim 10, wherein the reconstructing of the single encoded digital composite signal further comprises:

extracting a group of individual spectrum signals having positive frequency components and a group of individual spectrum signals having negative frequency components from the single encoded digital composite signal;

changing the sampling rate of the group of individual spectrum signals having positive frequency components and the group of individual spectrum signals having negative frequency components;

shifting the group of individual spectrum signals having positive frequency components and the group of individual spectrum signals having negative frequency components in accordance with a tuning frequency; and combining the group of shifted, individual spectrum signals having positive frequency components and the group of shifted, individual spectrum signals having negative frequency components.

14. The wireless processing method of claim 13, wherein the extraction of the group of individual spectrum signals having positive frequency components and the group of individual spectrum signals having negative frequency components is performed by a plurality of first single-band filters and a plurality of second single-band filters, wherein the plurality of first single-band filters is configured to extract the group of individual spectrum signals having positive frequency components and the plurality of second single-band filters is configured to extract the group of individual spectrum signals having negative frequency components.

15. The wireless processing method of claim 13, wherein the change of sampling rate depends on the first code rate and second code rate and may be an integer or a fractional value.

16. The wireless processing method of claim 13, wherein the shifting operation on the group of individual spectrum signals having positive frequency components and the group of individual spectrum signals having negative frequency components in accordance with the ratio of the second code rate to the first code rate.

17. The wireless processing method of claim 10, further comprising providing control signal parameters for controlling of encoding, reconstructing, and decoding operations.

18. The wireless processing method of claim 10, wherein the control signal parameters include on or more of the following: code type, code rate, up-sampling ratio, sampling rate, intermediate frequency, tuning frequency and filter coefficient(s).

* * * * *